(12) United States Patent
Nimura

(10) Patent No.: US 7,679,283 B2
(45) Date of Patent: Mar. 16, 2010

(54) EL DISPLAY DEVICE, METHOD OF MANUFACTURING THE SAME, AND ELECTRONIC APPARATUS

(75) Inventor: Toru Nimura, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 401 days.

(21) Appl. No.: 11/228,273

(22) Filed: Sep. 19, 2005

(65) Prior Publication Data

US 2006/0066229 A1 Mar. 30, 2006

(30) Foreign Application Priority Data

Sep. 30, 2004 (JP) ............................. 2004-289223
Aug. 2, 2005 (JP) ............................. 2005-223630

(51) Int. Cl.
*H01J 1/62* (2006.01)
(52) U.S. Cl. ...................................... 313/506; 313/503
(58) Field of Classification Search ......... 313/498–512; 315/169.1, 169.3; 257/59
See application file for complete search history.

(56) References Cited

U.S. PATENT DOCUMENTS

| 6,836,068 | B2 | 12/2004 | Furugori et al. |
| 6,888,520 | B2 | 5/2005 | Ouchi et al. |
| 7,015,638 | B2 | 3/2006 | Furugori et al. |
| 7,129,635 | B2 * | 10/2006 | Tsujimura .................. 313/506 |
| 7,161,185 | B2 * | 1/2007 | Yamazaki et al. ............. 257/88 |
| 7,173,371 | B2 * | 2/2007 | Pang et al. .................. 313/504 |
| 7,199,520 | B2 * | 4/2007 | Fujii et al. .................. 313/506 |
| 7,221,092 | B2 * | 5/2007 | Anzai et al. ................. 313/506 |
| 2005/0127372 | A1 * | 6/2005 | Ishihara et al. ................ 257/72 |
| 2005/0190130 | A1 | 9/2005 | Ouchi et al. |
| 2005/0258744 | A1 * | 11/2005 | Kwak et al. ................. 313/504 |
| 2006/0139268 | A1 | 6/2006 | Kobayashi |
| 2007/0178224 | A1 | 8/2007 | Fujii et al. |

FOREIGN PATENT DOCUMENTS

| JP | 2001-332392 | 11/2001 |
| JP | A-2003-017264 | 1/2003 |
| JP | A-2003-208109 | 7/2003 |
| JP | A-2004-086014 | 3/2004 |
| WO | WO 2004/068910 A1 | 8/2004 |

* cited by examiner

*Primary Examiner*—Joseph L Williams
(74) *Attorney, Agent, or Firm*—Oliff & Berridge, PLC

(57) ABSTRACT

An EL display device has first and second pixel electrodes and a counter electrode formed of a transparent conductive film, a sealing-side light-emitting area for extracting light emitted from a light-emitting functional layer from a sealing member formed on the first pixel electrode, a substrate-side light-emitting area for extracting light emitted from the light-emitting functional layer from the substrate is formed on the second pixel electrode, a light-shielding layer which is adjacent to the first pixel electrode in the sealing-side light-emitting area and the counter electrode in the substrate-side light-emitting area is formed, and the light-emitting functional layer emits light independently in the sealing-side light-emitting area and the substrate-side light-emitting area.

12 Claims, 8 Drawing Sheets

EL DISPLAY DEVICE, METHOD OF MANUFACTURING THE SAME, AND ELECTRONIC APPARATUS

BACKGROUND

The present invention relates to an electroluminescent (EL) display device, to a method of manufacturing the EL display device, and to an electronic apparatus.

In the related art, there has been proposed a double-sided light-emitting type electroluminescent display device (hereinafter, referred to as 'EL display device') which emits light onto both transparent cathode and anode electrodes (e.g., see JP-A-2001-332392).

However, in the EL display device disclosed in JP-A-2001-332392, there has been a problem in that since an opposite side of the EL display device can be seen, a displayed image is reversed on a front side and a rear side of a panel, thus different images cannot be simultaneously displayed on the front side and the rear side of the panel.

In addition, in the EL display device disclosed in JP-A-2001-332392, there has been a problem in that since the EL display device does not have a top emission structure, the efficiency of extracting light is reduced due to array arrangement in a matrix-type panel.

Further, there has been a problem in that it is not possible to adjust the balance of luminance at the front side and the rear side, and to change the amount of information in a panel having the same light-emitting area on both faces.

SUMMARY

An advantage of some aspects of the invention is that it provides a double-sided light-emitting EL display device capable of simultaneously displaying different images on both the front side and rear side, a method of manufacturing the EL display device, and an electronic apparatus equipped with the EL display device.

According to an aspect of the invention, an EL display device includes: first and second pixel electrodes formed on a substrate, for each sub-pixel within a unit pixel; a counter electrode opposite to the first and second pixel electrodes; a light-emitting functional layer provided between the first and second pixel electrodes and the counter electrode; and a sealing member which seals the light-emitting functional layer. The first and second pixel electrodes and the counter electrode are formed of a transparent conductive film, a sealing-side light-emitting area for extracting light emitted from the light-emitting functional layer from the sealing member is formed on the first pixel electrode, a substrate-side light-emitting area for extracting light emitted from the light-emitting functional layer from the substrate is formed on the second pixel electrode, a light-shielding layer which is adjacent to the first pixel electrode in the sealing-side light-emitting area and the counter electrode in the substrate-side light-emitting area is formed, and the light-emitting functional layer emits light independently in the sealing-side light-emitting area and the substrate-side light-emitting area.

In the sealing-side light-emitting area, when the light-emitting functional layer emits light by the first pixel electrode and the counter electrode, the light is not emitted to the first pixel electrode on which the light-shielding layer is formed, but passes through the counter electrode and the sealing member to be emitted.

Meanwhile, in the substrate-side light-emitting area, when the light-emitting functional layer emits light by the second pixel electrode and the counter electrode, the light is not emitted to the counter electrode on which the light-shielding layer is formed, but passes through the second pixel electrode and the substrate to be emitted.

The sealing-side light-emitting area and the substrate-side light-emitting area are formed for each sub-pixel, and the light-emitting functional layer emits light independently in the sealing-side light-emitting area and the substrate-side light-emitting area. Accordingly, it is possible to independently perform a light-emitting operation to the sealing member and a light-emitting operation to the substrate in each sub-pixel.

For example, when there are RGB sub-pixels within a unit pixel, it is possible to perform full-color display in the unit pixel and, and at the same time, to perform the full-color display independently in the sealing member and the substrate.

According to the invention, since light can be independently emitted to the sealing member and the substrate in each sub-pixel, problems in the conventional double-sided light-emitting EL display device can be solved. In the related art, since an opposite side of an EL display device can be seen, an image is reversed on the front and rear sides of a panel. Accordingly, it was not possible to display different images simultaneously on the front and rear sides of the panel. In contrast, according to the invention, since the light-shielding layers are formed in the first pixel electrode in the sealing-side light-emitting area and the counter electrode in the substrate-side light-emitting area, and the light-emitting functional layer emits light independently in the sealing-side light-emitting area and the substrate-side light-emitting area, an opposite side of the EL display device cannot be seen and an image cannot be reversed on the front and rear sides of the panel.

Also, since the light-emitting functional layer emits light independently in the sealing-side light-emitting area and the substrate-side light-emitting area, it is possible to easily adjust luminance balance in each area and to easily change the amount of information in each area.

Further, in the EL display device according to the invention, preferably, at least one of the light-shielding layer formed on the first pixel electrode and the light-shielding layer formed on the counter electrode has a light-reflecting property.

Accordingly, it is possible to obtain the same effect as in the above-mentioned EL display device, and to improve light-emitting efficiency to display an image with a high luminance since the light-shielding layer has a light-reflecting property.

In more detail, light emitted from the light-emitting functional layer in the sealing-side light-emitting area passes through the counter electrode and the sealing member, and at the same time, is reflected by the light-shielding layer formed in the first pixel electrode and then passes through the counter electrode and the sealing member.

Meanwhile, light emitted from the light-emitting functional layer in the substrate-side light-emitting area passes through the second pixel electrode and the substrate, and at the same time, is reflected by the light-shielding layer formed in the counter electrode and then passes through the second pixel electrode and the substrate.

Accordingly, since the light-shielding layer has a light-reflecting property, it is possible to improve light-emitting efficiency in the sealing-side light-emitting area and the substrate-side light-emitting area.

Furthermore, in the EL display device according to the invention, preferably, at least one of the light-shielding layer formed on the first pixel electrode and the light-shielding layer formed on the counter electrode has a light-absorbing property.

Accordingly, it is possible to obtain the same effect as that of the above-mentioned EL display device and to improve the contrast since the light-shielding layer acts as a black matrix.

In more detail, when the light-shielding layer having a light-absorbing property is formed on the counter electrode in the substrate-side light-emitting area, the light-shielding layer absorbs external light which is incident from the sealing member. Accordingly, it is possible to improve the contrast of an image displayed on the sealing member. In addition, since the light-shielding layer absorbs external light which is incident from the substrate side and passes through the light-emitting layer, it is possible to improve the contrast of an image displayed on the substrate side without the need to add a deflecting plate.

When the light-shielding layer having a light-absorbing property is formed on the first pixel electrode in the sealing-side light-emitting area, the light-shielding layer absorbs external light which is incident from the substrate side. Accordingly, it is possible to improve the contrast of an image displayed on the substrate side. In addition, since the light-shielding layer absorbs external light which is incident from the sealing member side and passes through the light-emitting layer, it is possible to improve the contrast of an image displayed on the sealing member side without the need to add a deflecting plate.

Accordingly, since the light-shielding layer has a light-absorbing property and acts as a black matrix, it is possible to improve the contrast of an image displayed on the sealing-side light-emitting area and the substrate-side light-emitting area.

In addition, in the EL display device according to the invention, preferably, first and second switching elements are connected to each of the first and second pixel electrodes, and the light-emitting functional layer emits light by driving the first and second switching elements.

Accordingly, it is possible to allow the light-emitting functional layer to emit light by means of the first and second switching elements. Accordingly, it is possible to allow the light-emitting functional layer to emit light independently in the sealing-side light-emitting area and the substrate-side light-emitting area.

Moreover, in the EL display device according to the invention, preferably, a planarizing film is formed between the first and second pixel electrodes and the first and second switching elements.

The term 'planarizing film' means a layer which acts to cover and planarize an uneven portion or a step portion caused by the first and second switching elements formed on the substrate, or wires connected to the first and second switching elements. The planarizing film acts as an interlayer insulation layer to isolate the first and second switching elements from the first and second pixel electrodes.

Since the planarizing film is formed between the first and second pixel electrodes and the first and second switching elements, the first and second pixel electrodes can be formed on a planarized surface.

Also, since the planarizing film is formed, a light-emitting area can be formed above of the switching element. Accordingly, the sealing-side light-emitting area can be provided above the switching element, thereby improving an aperture ratio.

Further, in the EL display device according to the invention, preferably, the light-shielding layer formed on the first pixel electrode in the sealing-side light-emitting area overlaps the first switching element with the planarizing film interposed therebetween in plan view.

According to the invention, since the light-shielding layer formed on the first pixel electrode and the switching element overlap each other with the planarizing film interposed therebetween in plan view, light emitted from the substrate-side light-emitting area passes through the second pixel electrode and the substrate without being blocked by the first switching element. Accordingly, it is possible to improve efficiency of extracting the light emitted from the substrate-side light-emitting area.

Meanwhile, in the related art, when the emitted light is extracted to the substrate side, the emitted light is shielded by a switching element or an array wire, thereby reducing the efficiency of extracting the emitted light. However, the present embodiment can solve this problem.

Furthermore, in the EL display device according to the invention, preferably, the first and second switching elements are formed in an area other than the substrate-side light-emitting area.

At this time, 'an area other than the substrate-side light-emitting area' means an area in which the sealing-side light-emitting area or the partition wall is formed.

Accordingly, light emitted from the substrate-side light-emitting area passes through the second pixel electrode and the substrate without being blocked by the first or second switching element. As a result, it is possible to improve efficiency of extracting the light emitted from the substrate-side light-emitting area.

In addition, in the EL display device according to the invention, preferably, preferably, each of the first and second switching elements is connected to a capacitive element, the capacitive element overlapping the sealing-side light-emitting area.

The capacitive element is preferably formed by interposing an insulation film between a gate electrode and a source electrode in the first and second switching elements.

Accordingly, light emitted from the substrate-side light-emitting area passes through the second pixel electrode and the substrate without being blocked by the capacitive element. As a result, it is possible to improve efficiency of extracting the light emitted from the substrate-side light-emitting area.

Moreover, in the EL display device according to the invention, preferably, each of the first and second switching elements is connected to a power line, the power line overlapping the sealing-side light-emitting area.

According to the invention, light emitted from the substrate-side light-emitting area passes through the second pixel electrode and the substrate without being blocked by the power line. Accordingly, it is possible to improve efficiency of extracting the light emitted from the substrate-side light-emitting area.

Further, in the EL display device according to the invention, preferably, a partition wall is formed to partition the light-emitting functional layer, the partition wall overlapping at least one of the first and second switching elements with the planarizing film interposed therebetween in plan view.

According to the invention, light emitted from the substrate-side light-emitting area passes through the second pixel electrode and the substrate without being blocked by the first and second switching elements. Accordingly, it is possible to improve efficiency of extracting the light emitted from the substrate-side light-emitting area.

Meanwhile, in the related art, when the emitted light is extracted to the substrate, the emitted light is shielded by a switching element or an array wire, thereby reducing the efficiency of extracting the emitted light. However, the present embodiment can solve this problem.

Furthermore, in the EL display device according to the invention, preferably, the light-emitting functional layer is formed commonly in the sealing-side light-emitting area and the substrate-side light-emitting area.

The light-emitting functional layer is formed commonly in the sealing-side light-emitting area and the substrate-side light-emitting area. Accordingly, since it is not necessary to form the light-emitting functional layer independently in the sealing-side light-emitting area and the substrate-side light-emitting area, the light-emitting functional layer can be easily formed.

In addition, in the EL display device according to the invention, preferably, the light-emitting functional layer is formed independently in the sealing-side light-emitting area and the substrate-side light-emitting area.

According to the invention, since the light-emitting functional layer is formed independently in the sealing-side light-emitting area and the substrate-side light-emitting area, it is possible to form the light-emitting functional layer having a stable layer thickness in each light-emitting area.

Further, according to another aspect of the invention, A method of manufacturing an EL display device includes: forming first and second switching elements above a substrate; forming first and second pixel electrodes connected to each of the first and second switching elements; forming a light-emitting functional layer above the first and second pixel electrodes; forming a counter electrode opposite to the first and second pixel electrodes; and forming a sealing member which seals the light-emitting functional layer. The first and second pixel electrodes and the counter electrode are formed of a transparent conductive film, a light-shielding layer which is adjacent to the first pixel electrode in the sealing-side light-emitting area and the counter electrode in the substrate-side light-emitting area is formed, a sealing-side light-emitting area for extracting light emitted from the light-emitting functional layer from the sealing member is formed on the first pixel electrode, and a substrate-side light-emitting area for extracting light emitted from the light-emitting functional layer from the substrate is formed on the second pixel electrode.

In the EL display device manufactured by the above-mentioned method, the light-emitting functional layer can emit light independently in the sealing-side light-emitting area and the substrate-side light-emitting area according to the first and second switching elements.

Also, since light can be independently emitted to the sealing member and the substrate, problems in the conventional double-sided light-emitting EL display device can be solved. In the related art, since an opposite side of an EL display device can be seen, an image is reversed on the front side and the rear side of a panel. Accordingly, it was not possible to display different images simultaneously on the front side and the rear side of the panel. In contrast, according to the invention, since the light-shielding layers are formed in the first pixel electrode in the sealing-side light-emitting area and the counter electrode in the substrate-side light-emitting area, and the light-emitting functional layer emits light independently in the sealing-side light-emitting area and the substrate-side light-emitting area, an opposite side of the EL display device cannot be seen and an image cannot be reversed on the front side and the rear side of the panel.

Also, since the light-emitting functional layer emits light independently in the sealing-side light-emitting area and the substrate-side light-emitting area, it is possible to easily adjust luminance balance in each area and to easily change the amount of information in each area.

Further, in the method of manufacturing the EL display device according to the invention, preferably, the first and second pixel electrodes are formed for each sub-pixel within a unit pixel.

The sealing-side light-emitting area and the substrate-side light-emitting area are formed for each sub-pixel, and the light-emitting functional layer emits light independently in the sealing-side light-emitting area and the substrate-side light-emitting area. Accordingly, it is possible to independently perform a light-emitting operation to the sealing member and a light-emitting operation to the substrate in each sub-pixel.

Furthermore, in the method of manufacturing the EL display device according to the invention, preferably, the light-shielding layer is formed on the counter electrode in the substrate-side light-emitting area by using a mask deposition method.

Accordingly, the light-shielding layer can be formed on the counter electrode by depositing according to a predetermined mask pattern.

In addition, an electronic apparatus according to the invention includes the EL display device as a display unit.

An example of the electronic apparatus according to the invention is a mobile phone. Accordingly, by employing the EL display device according to the invention as a display unit of the electronic apparatus, it is possible to realize the electronic apparatus equipped with the display unit capable of simultaneously displaying different images on a front side and a rear side.

BRIEF DESCRIPTION OF THE DRAWINGS

The invention will be described with reference to the accompanying drawings, wherein like numbers reference like elements.

DETAILED DESCRIPTION OF EMBODIMENTS

Figure 1:
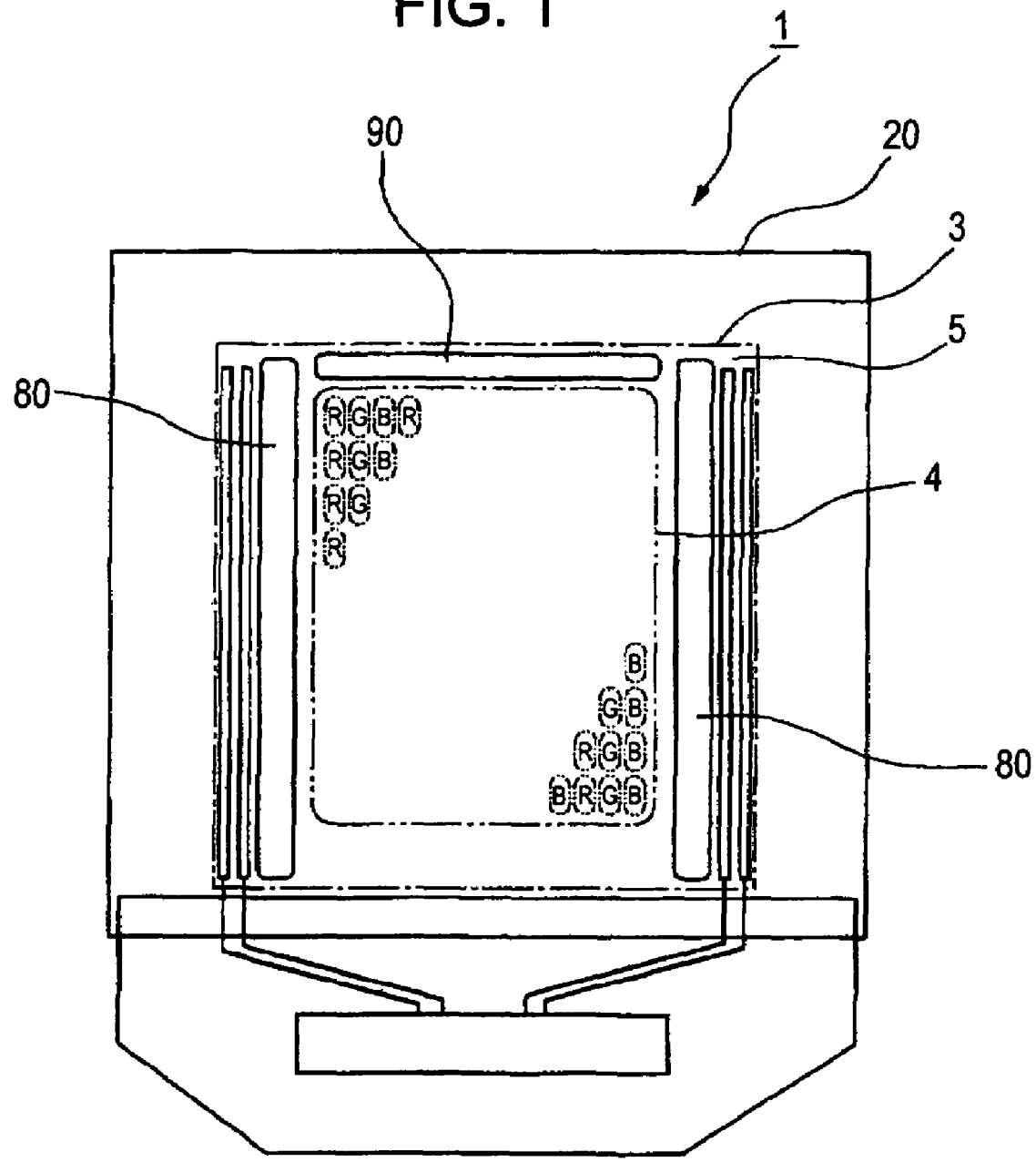
FIG. 1 is a plan view schematically illustrating the configuration of an EL display device according to the invention.

Exemplary embodiments of an EL display device and an electronic apparatus according to the invention will now be described in detail with reference to the accompanying drawings. The invention is not limited to the exemplary embodiments, but various changes in form and details may be made therein without departing from the scope of the invention. In the drawings, individual layers and components are depicted in different scales so that they can be easily recognized in the drawings.

EL Display Device

FIG. 1 is a plan view schematically illustrating a configuration of an EL display device 1. The EL display device according to the present embodiment uses an electroluminescent material, which is an example of an electro-optical material, particularly, an organic EL material. In the EL display device, the organic EL material emits light by an active matrix method using a Thin Film Transistor (TFT).

The EL display device according to the present embodiment is a double-sided light-emitting EL display device capable of displaying an image on both the front and rear sides of a panel. In other words, it is a so-called double-emission-type EL display device which performs top-emission-type display and bottom-emission-type display.

As shown in FIG. 1, the EL display device 1 includes a substrate 20 made of an insulation material, a pixel part 3 (within an area surrounded by a one-dot-chain line in FIG. 1) and a cover substrate (which will be described below) covering the pixel part 3, which are provided on the substrate 20.

In the pixel part 3, emitted light passes through the substrate 20 to display an image, and at the same time, passes through the cover substrate 46 to display an image.

The pixel part 3 is partitioned into an actual display area 4 (an area surrounded by a two-dot-chain line in FIG. 1) at the center and a dummy area 5 (an area between the one-dot-chain line and the two-dot-chain line) located outside the actual display area 4. A plurality of pixels is provided in the actual display area 4. Scanning line driving circuits 80 and inspection circuits 90 are provided below the dummy area 5.

Each pixel formed in the actual display area 4 has RGB sub-pixels (where R is red, G is green, and B is blue), which are configured to emit light from both the substrate 20 and the cover substrate 46. Also, a single pixel is composed of three RGB sub-pixels each of which emits one of light components having RGB colors.

Hereinafter, a display area which is a minimum element to display an image is referred to as a 'sub-pixel', and a display area composed of RGB sub-pixels is referred to as a 'pixel' (unit pixel). With such a configuration, a full-color display is performed by using a double emission method.

The scanning line driving circuit 80 provided below the dummy area 5 includes a shift register and a level register, and drives TFTs provided in each sub-pixel in the actual display area 4. The inspection circuit 90 provided below the dummy area 5 is a circuit for inspecting operating conditions of the EL display device 1, and includes, for example, an inspection information output unit (not shown) outputting inspection results to the outside. The inspection circuit 90 is configured to inspect the quality or defects of display devices during manufacture or shipment.

Driving voltages for driving the scanning line driving circuit 80 and the inspection circuit 90 are applied through a driving voltage conducting unit from a predetermined voltage source. Driving control signals and driving voltages applied to the scanning line driving circuit 80 and the inspection circuit 90 are transmitted and applied through a driving control signal conducting unit and a driving voltage conducting unit from a predetermined main driver which operates the EL display device 1. In this case, the driving control signals are instruction signals applied from a main driver associated with controls when the scanning line driving circuit 80 and the inspection circuit 90 output signals.

The EL display device 1 will now be described in detail with reference to FIGS. 2 to 4.

Figure 2:
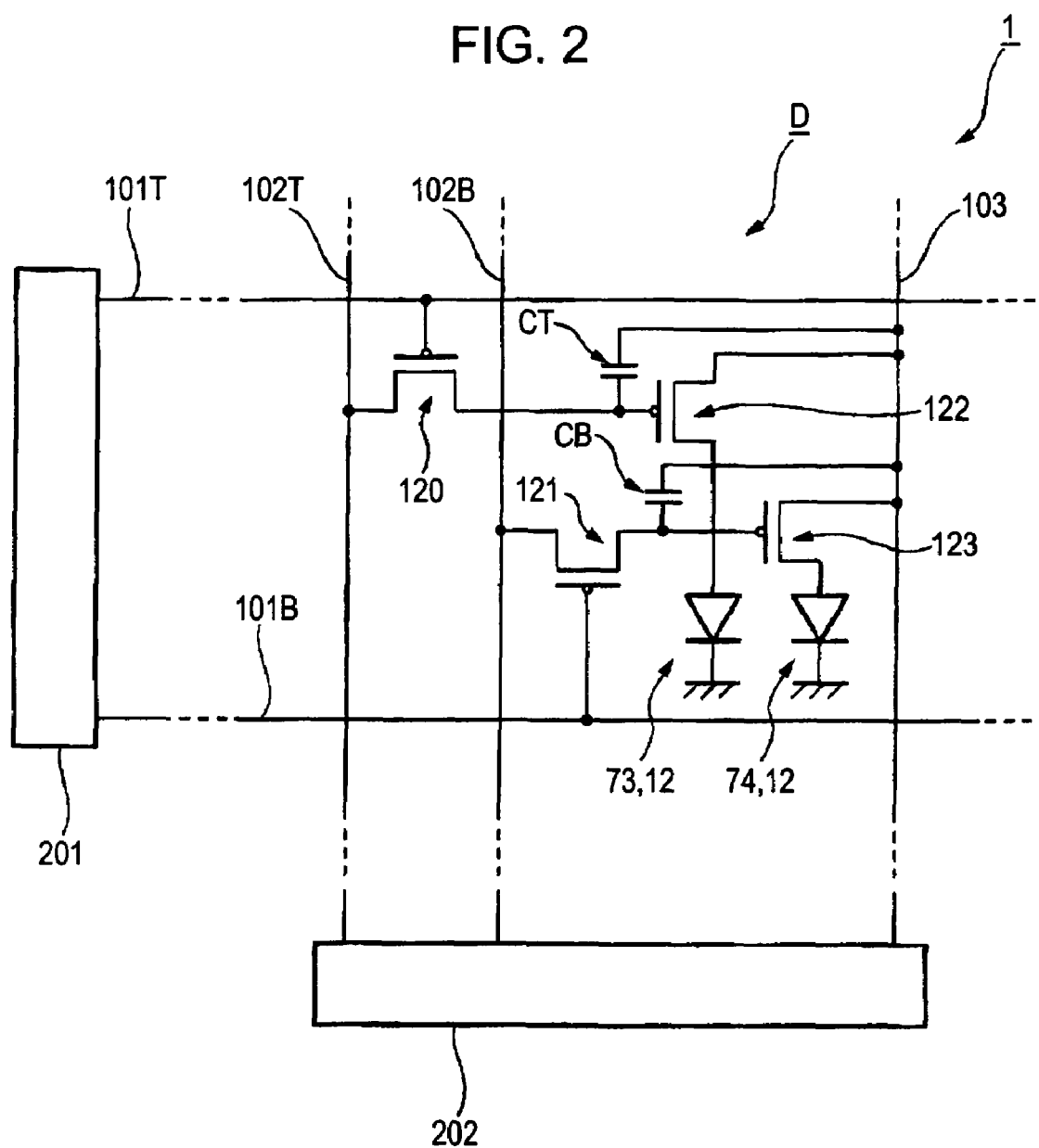
FIG. 2 is an equivalent circuit diagram of a sub-pixel in the EL display device according to the invention.

FIG. 2 is an equivalent circuit diagram of a single sub-pixel in an actual display area 4 of the EL display device 1. FIG. 3 is an enlarged plan view of a single sub-pixel in an actual display area 4 of the EL display device 1. FIG. 4 is a cross-sectional view taken along the line IV-IV of FIG. 3.

As shown in FIG. 2, the EL display device 1 is an active-matrix-type device which uses a TFT as a switching element. The EL display device 1 includes scanning lines 101T and 101B, data lines 102T and 102B extending in a direction perpendicular to that of the scanning lines 101T and 101B, and a power line 103 extending parallel to the data lines 102T and 102B. These lines extend in a direction in which a plurality of sub-pixels D arranged in a matrix shape is arranged. That is, the scanning lines 101T and 101B extend in a transverse direction of the drawing, while the data lines 102T and 102B and the power line 103 extend in a longitudinal direction of the drawing. Although an equivalent circuit of a single sub-pixel D is shown in FIG. 2 in the present embodiment, a plurality of sub-pixels D arranged in a matrix shape is connected in parallel with the scanning lines 101T and 101B, the data lines 102T and 102B, and the power line 103.

The scanning lines 101T and 101B are connected to a scanning line driving circuit 201 including a shift register and a level shifter. The scanning line driving circuit 201 can apply different scanning signals to the scanning lines 101T and 101B.

In addition, the data lines 102T and 102B are connected to a data line driving circuit 202 including a shift register, a level shifter, a video line, and an analog switch. The data line driving circuit 202 can apply different data signals to the data lines 102T and 102B.

Accordingly, the EL display device 1 displays an image in a double emission method to be described later by applying signals to the scanning lines 101T and 101B or data lines 102T and 102B.

The sub-pixel D has a sealing-side light-emitting area 73 performing a top emission display operation by emitting light to the cover substrate 46, and a substrate-side light-emitting area 74 performing a bottom emission display operation by emitting light to a substrate 20.

In the sealing-side light-emitting area 73, a light-emitting functional layer 12 is driven by a switching TFT 120 and a driving TFT (first switching element) 122.

Also, in the substrate-side light-emitting area 74, the light-emitting functional layer 12 is driven by a switching TFT 121 and a driving TFT (second switching element) 123.

Operations of each TFT and driving of the light-emitting functional layer 12 in the sealing-side light-emitting area 73 and the substrate-side light-emitting area 74 will now be described.

In TFT 120, when a scanning signal is applied to a gate electrode through the scanning line 101T, a data signal of the data line 102T is applied to a storage capacitor (capacitive element) CT through a channel of the TFT 120. As a result, the data signal of the TFT 120 is held by means of the storage capacitor CT. When the data signal supplied from the TFT 120 or data signal held in the storage capacitor CT is applied to a gate electrode of the TFT 122, a driving current of the power line 103 flows through a channel of the TFT 122 and flows from a pixel electrode to a cathode electrode. Accordingly, in the sealing-side light-emitting area 73, the light-emitting functional layer 12 provided between the pixel electrode and the cathode electrode emits light according to the amount of current flowing therethrough.

In TFT 121, when a scanning signal is applied to a gate electrode through the scanning line 101B, a data signal of the data line 102B is applied to a storage capacitor (capacitive element) CB through a channel of the TFT 121. As a result, the data signal of the TFT 121 is held by means of the storage capacitor CB. When the data signal applied from the TFT 121 or data signal held in the storage capacitor CB is applied to a gate electrode of the TFT 123, a driving current of the power line 103 flows through a channel of the TFT 123 and flows from a pixel electrode to a cathode electrode. Accordingly, in the substrate-side light-emitting area 74, the light-emitting functional layer 12 provided between the pixel electrode and the cathode electrode emits light according to the amount of current flowing therethrough.

By operation of the TFTs 120, 121, 122, and 123, the sub-pixel D can emit light onto the substrate 20 and the cover substrate 46.

Next, a plan view of a sub-pixel D will now be described with reference to FIG. 3.

Figure 3:
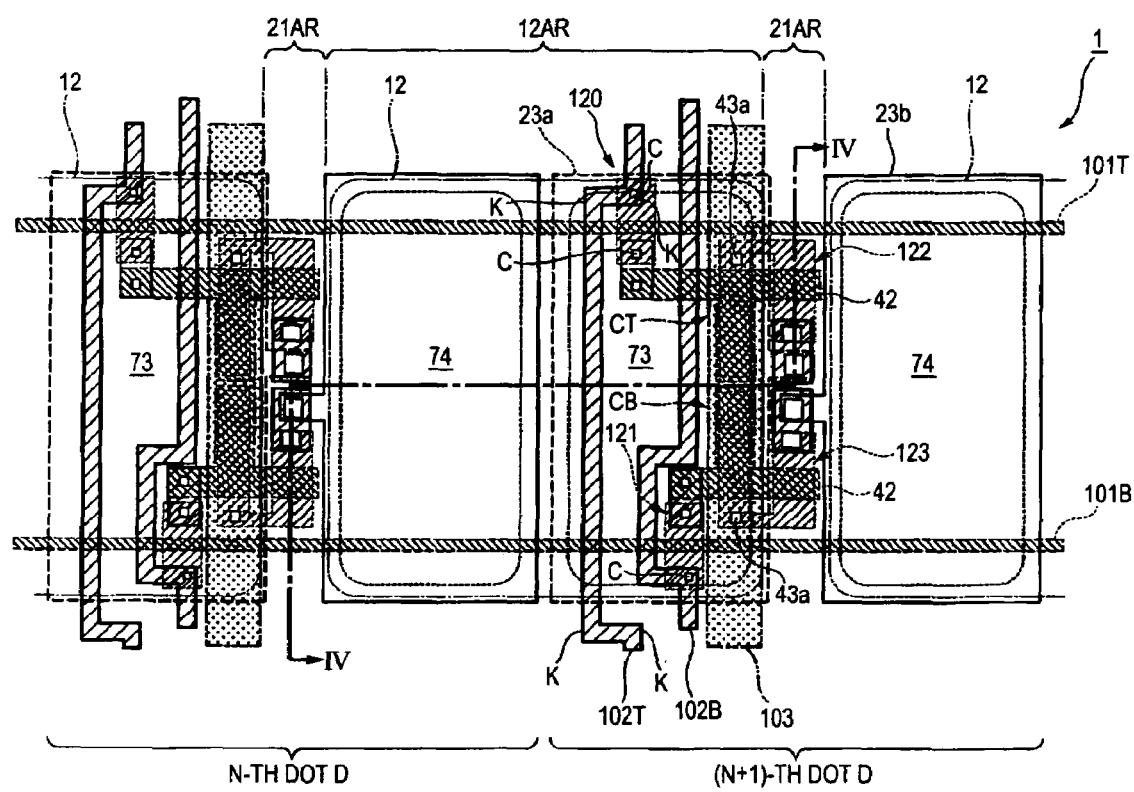
FIG. 3 is an enlarged plan view of a sub-pixel in the EL display device according to the invention.

In FIG. 3, to explain a stacked structure of various lines constituting the sub-pixel D, the lines are depicted to be transmissive.

Individual components shown in FIG. 3 are formed on the substrate 20. Interlayer insulation films are formed between the individual components (lines, TFTs, and capacitive elements) to electrically insulate from each other. Also, contact holes are formed in the interlayer insulation films to electrically conduct individual components each other.

As shown in FIG. 3, the EL display device 1 is configured such that an n-th sub-pixel D(n) and an (n+1)-th sub-pixel D(n+1) are adjacent to each other in a transverse direction of the drawing.

Also, the EL display device 1 has a light-emitting functional layer area 12AR which becomes a planar pattern of the light-emitting functional layer 12 across the sub-pixels D(n), D(n+1). The light-emitting functional layer area 12AR is commonly formed both on a substrate-side light-emitting area 74 of the sub-pixel D(n) and on a sealing-side light-emitting area 73 of the sub-pixel D(n+1). Also, the light-emitting functional layer area 12AR is surrounded by a bank area (partition wall) 21AR which becomes a planar pattern of an organic bank 21. Also, the organic bank area 21AR is formed in the center of the individual sub-pixels D(n) and D(n+1), and isolates the sealing-side light-emitting area 73 and the substrate-side light-emitting area 74 from each other in the individual sub-pixels.

In FIG. 3, the bank area 21AR extends in a longitudinal direction of the drawing and formed on both sides of the light-emitting functional layer area 12AR, and also extends in a transverse direction of the drawing. Thus, the light-emitting functional layer area 12AR is surrounded by the bank area 21AR extending in longitudinal and transverse directions of the drawing.

In the sealing-side light-emitting area 73 and the substrate-side light-emitting area 74, the scanning lines 101T and 101B extend toward a direction in which the sub-pixels D are adjacent to each other, and are formed both on the sealing-side light-emitting area 73 and on the substrate-side light-emitting area 74.

Meanwhile, the data lines 102T and 102B, the switching TFTs 120, 121, and the power line 103 extend in a longitudinal direction of the drawing, and overlap only the sealing-side light-emitting area 73. Also, channel areas of the TFTs 120, 121 overlap the scanning lines 101T and 101B which act as gate electrodes of the TFTs 120, 121.

Also, the data lines 102T and 102B have a plurality of bent portions K to prevent the data lines 102T and 102B from overlapping each other, or to prevent the data lines 102T and 102B from overlapping the TFTs 120, 121. Contact holes C are formed on portions in which the TFTs 120,121 and the bent portions K overlap each other to allow the data line 102T and a source area of the TFT 120 to be electrically connected and to allow the data line 102B and a source area of the TFT 121 to be electrically connected. By forming the bent portions K, it is possible to form the data lines 102T and 102B or the TFTs 120, 121 within the sealing-side light-emitting area 73.

In the bank area 21AR, the driving TFTs 122 and 123 are provided to overlap the bank area 21AR.

A drain area 41D (which will be described below) of the TFT 122 is connected to a first pixel electrode 23a (which will be described below) through a contact hole 44a (which will be described below). Also, a drain area of the TFT 123, which is a high concentration impurity area 41D, is connected to a second pixel electrode 23b (which will be described below) through a contact hole 44a.

Also, a source area of the TFT 122, which is a high concentration impurity area 41S (which will be described below), is connected to the power line 103 through a contact hole 43a (which will be described below). Also, the source area 41S of the TFT 123 is connected to the power line 103 through the contact hole 43a.

A gate electrode 42 of the TFT 122 is electrically connected to the drain electrode of the TFT 120. A part of the gate electrode 42 of TFT 122 is disposed to be opposite to the power line 103 with an interlayer insulation film interposed therebetween to thereby form the storage capacitor CT which is described above.

The gate electrode 42 of the TFT 123 is electrically connected to the drain electrode of the TFT 121. A part of the gate electrode 42 of the TFT 123 is disposed to be opposite to the power line 103 with an interlayer insulation film interposed therebetween to form the storage capacitor CB which is described above. As a result, the storage capacitors CT and CB overlap the sealing-side light-emitting area 73.

A cross-sectional view of a sub-pixel D will now be described with reference to FIG. 4.

Figure 4:
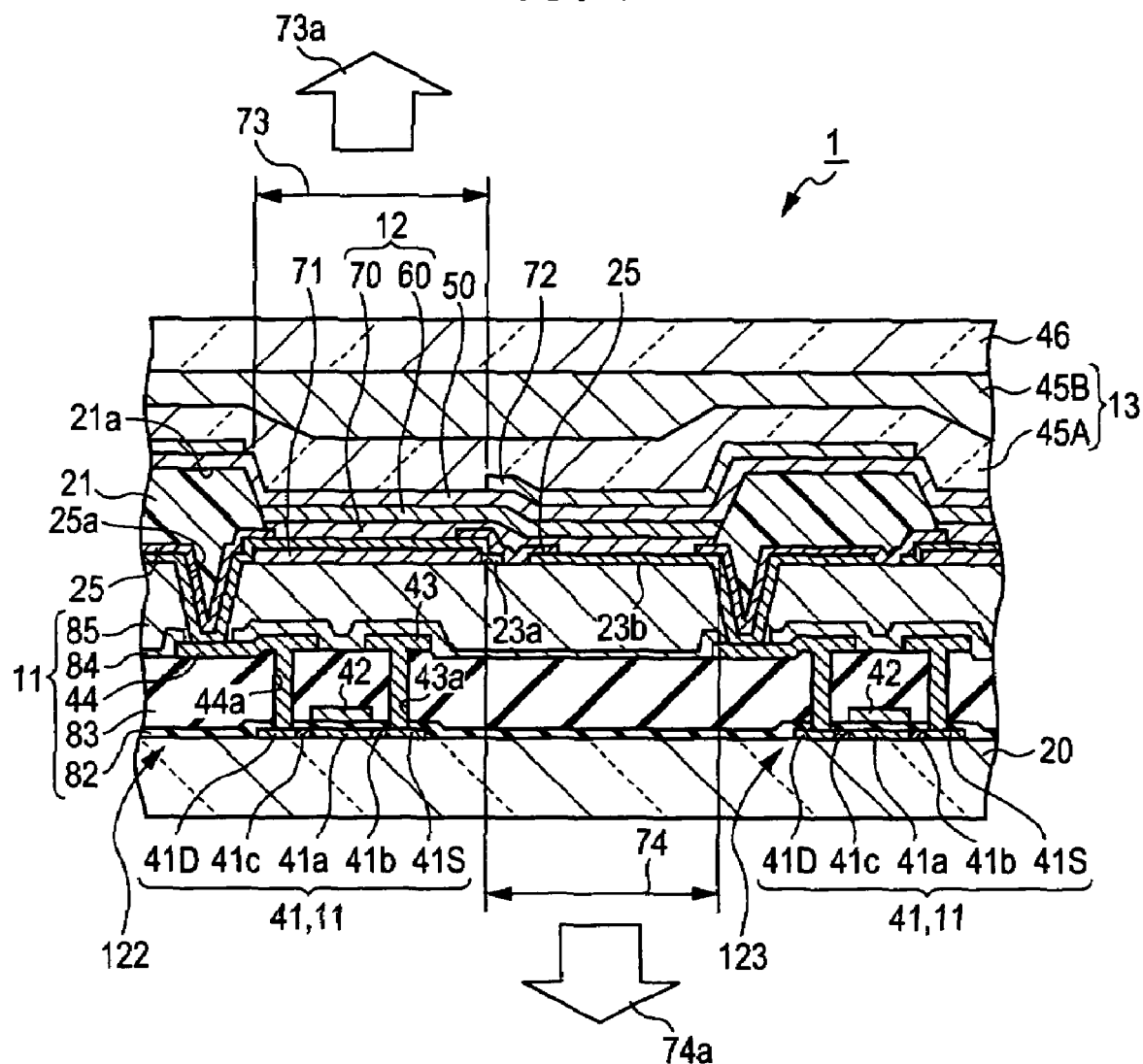
FIG. 4 is an enlarged cross-sectional view of a sub-pixel in an EL display device according to the invention.

As shown in FIG. 4, the EL display device 1 includes a TFT element 11, a light-emitting functional layer 12, and a sealing member 13, which are provided between the substrate 20 and the cover substrate (sealing member) 46. Also, the EL display device 1 includes a sealing-side light-emitting area 73 for passing light emitted from the light-emitting functional layer 12 through the sealing member 13 and emitting the light from the cover substrate 46, and a substrate-side light-emitting area 74 for passing light emitted from the light-emitting functional layer 12 through the TFT element 11 and emitting the light from the substrate 20, thereby performing sealing-side light-emitting operation 73a and substrate-side light-emitting operation 74a, respectively.

Each component of the EL display device 1 will now be described in detail.

The substrate 20 is formed of a transparent substrate for performing substrate-side light-emitting operation. Examples of the transparent substrate include a glass substrate or a resin substrate. The glass substrate has a relatively high heat resistance, so that it is possible to easily form TFT on the glass substrate by a well-known semiconductor manufacturing process. Meanwhile, since the resin substrate has a good flexibility, it is suitable to a flexible EL display device 1.

The TFT element 11 provided on the substrate 20 will now be described.

The TFT element 11 has TFTs 122 and 123 to allow the light-emitting functional layer 12 to emit light by an active matrix drive method. The TFTs 122 and 123 are switching elements for performing sealing-side light-emitting operation and substrate-side light-emitting operation, respectively. The two TFTs are formed in each sub-pixel D of an actual display area 4. Also, in the vicinity of the TFTs 122 and 123, a silicon layer 41, a gate insulation layer 82, a gate electrode 42, an interlayer insulation film 83, a source electrode 43 (power line 103), a drain electrode 44, a passivation film 84, and a planarizing film 85 are sequentially stacked. Also, pixel electrodes 23a and 23b are formed on a surface of the planarizing film 85.

Although the silicon layer 41 is formed on the substrate 20 in the present embodiment, a base protection layer may be provided between the substrate 20 and the silicon layer 41. The base protection layer acts as a barrier layer for preventing diffusion of impurity into the silicon layer 41 from the substrate 20. The base protection layer is mainly made of inorganic material such as $SiO_2$.

The silicon layer 41 is made of a semiconductor material, and includes high concentration impurity areas 41S and 41D and low concentration impurity areas 41b and 41c, which are impurity-doped areas, and a channel area 41a located to face the gate electrode 42. The high concentration impurity areas 41S, 41D are electrically conducting with a source electrode 43 and a drain electrode 44, respectively, as described below. Also, the silicon layer 41 is a poly-silicon layer obtained by forming an amorphous silicon layer on a base protection layer 81 using a plasma CVD method and then growing crystals by a laser annealing method or a rapid heating method. Also, the silicon layer 41 is partly formed on a surface of the substrate 20 and is patterned by a well-known photolithography method, so that the silicon layer 41 is formed in an island shape.

Although the silicon layer 41 shown in FIG. 4 is formed in a display area and constitutes the TFTs 122 and 123 connected to the pixel electrodes 23a and 23b, p-channel and n-channel TFTs (the driving TFTs) included in the scanning line driving circuit 80 shown in FIG. 1 have the same basic structure as that of the silicon layer 41.

The gate insulation layer 82 is formed on a surface of the silicon layer 41 to isolate from the gate electrode 42. The gate insulation layer 82 is mainly made of $SiO_2$ and/or SiN, and is formed of a thickness of about 30 to 200 nm by a plasma CVD method or a heat-oxidation method.

The gate electrode 42 is made by forming a doped silicon or silicide film, or a metallic film such as an aluminum film, a chromium film, or a tantalum film on the entire surface of the gate insulation layer 82, and then patterning it by a photolithography method. The gate electrode 42 has a film thickness of about 500 nm.

The interlayer insulation film 83 acts to cover and planarize the gate electrode 42, and at the same time, to isolate the source electrode 43 and the drain electrode 44 from the gate electrode 42. The interlayer insulation film 83 is formed by a coating method, such as spin coat method, or a vapor deposition method, such as CVD (chemical vapor deposition) method. In case of the coating method, the interlayer insulation film 83 is formed by mixing inorganic material, such as SOG film, or organic material, such as acrylic resin, with a solvent, coating it, and then performing a heat treatment process or a baking process on it. In case of the vapor deposition method, the interlayer insulation film 83 is formed of $SiO_2$ or SiN.

The source electrode 43 and the drain electrode 44 are formed on a surface of the interlayer insulation film 83. Also, contact holes 43a and 44a are previously formed in the interlayer insulation film 83. Thus, when the source electrode 43 and the drain electrode 44 are formed, the source electrode 43 and the drain electrode 44 are connected to the high concentration impurity area 41S and 41D, respectively.

In order to form the source electrode 43 and the drain electrode 44, a metallic film, such as aluminum, chromium, or tantalum, having a film thickness of about 200 to 800 nm is formed to cover the interlayer insulation film 83. Then, an etching mask is formed to cover an area in which the source electrode 43 and the drain electrode 44 are to be formed. Finally, the metallic film is etched, thereby forming the source electrode 43 and the drain electrode 44.

The passivation film 84 is made of SiN by a vapor deposition method such as CVD. The passivation film 84 acts to prevent water from being permeated. Thus, when the planarizing film 85 is formed, the passivation film 84 protects water contained in a solvent from being permeated into the TFTs 122 and 123.

The planarizing film 85 acts to cover and planarize the uneven passivation film 84 formed when the source electrode 43 and the drain electrode 44 are formed. Accordingly, a surface of the planarizing film 85, i.e., a surface of the pixel electrodes 23a and 23b, is planarized. The planarizing film 85 also acts as an interlayer insulation layer.

In order to form the planarizing film 85, a liquid material containing acrylic resin is applied by a spin coat method, and then cured by a heat treatment process. By performing the spin coat method, the unevenness of the source electrode 43 and the drain electrode 44 is covered and planarized.

The pixel electrodes 23a and 23b are formed on the planarizing film 85 and contact holes are formed with the planarizing film 85 interposed therebetween. The pixel electrodes 23a and 23b and the drain electrode 44 are connected to each other through wires embedded in the contact holes. That is, the pixel electrodes 23a and 23h are electrically connected to the high concentration impurity area 41D of the silicon layer 41 through the drain electrode 44.

The TFT (the driving TFT) included in the scanning line driving circuit 80 and the inspection circuit 90, e.g., n-channel or p-channel TFT constituting a reverser included in a shift register, has the same structure as that of the TFTs 122 and 123 except that it is not connected to the pixel electrodes 23a and 23b, and is formed by the same process.

The pixel electrodes 23a and 23b, the light-emitting functional layer 12, and a cathode electrode (counter electrode) 50, which are formed on the TFT element 11, will now be described.

The pixel electrodes 23a and 23b are a first pixel electrode corresponding to the sealing-side light-emitting area 73, and a second pixel electrode corresponding to the substrate-side light-emitting area 74, respectively. The first pixel electrode 23a and the second pixel electrode 23b are made of a transparent metal such as ITO (Indium Tin Oxide) or IZO (Indium Zinc Oxide: registered trademark of Idemitsu Kosan Co., Ltd.). Preferably, the first pixel electrode 23a and the second pixel electrode 23b are made of a single structure or double structure of the metal.

A light-shielding layer 71 having a light-reflecting property is provided between the first pixel electrode 23a and the planarizing film 85. The light-shielding layer 71 is made of a metallic film, such as Al, Cr, Ta, Mo, Ti, and W. The light-shielding layer 71 and the TFT 122 overlap each other with the planarizing film 85 interposed therebetween in plan view. In other words, the light-shielding layer 71 covers the TFT 122 when viewed from the cover substrate 46 side. Also, the TFT 122 is not squeezed into the substrate-side light-emitting area 74. Thus, light emitted from the substrate-side light-emitting area 74 will not pass through the TFT 122.

Although the light-shielding layer 71 has a light-reflecting property in the present embodiment, the light-shielding layer 71 may have a light-absorbing property. In this case, the light-shielding layer 71 is preferably formed of a pigment dispersing resin.

In addition, although the light-shielding layer 71 and the TFT 122 overlap each other in plan view in the present embodiment, the light-shielding layer 71 and the TFT 123 may overlap each other in plan view.

Also, in the present embodiment, 'overlap each other' implies 'overlap each other completely or partly'.

On the pixel electrodes 23a and 23b, the light-emitting functional layer 12 and the cathode electrode 50 are formed. The light-emitting functional layer 12 includes a hole injecting/carrying layer 70 and an organic EL layer 60.

The hole injecting/carrying layer 70 is made of, for example, polythiophene derivatives, polypyrrole derivatives, or polythiophene derivatives- or polypyrrole derivatives-doped materials. In more detail, the hole injecting/carrying layer 70 is made of 3,4-polyethylenedioxythiophene/polystyrenesulfonate (PEDOT/PSS) dispersion, which is formed by dispersing 3,4-polyethylenedioxythiophene in polystyrenesulfonate as a dispersion medium and then dispersing it in water.

The organic EL layer 60 employs well-known luminescent materials emitting fluorescence or phosphorescence. It preferably employs (poly)fluorene derivatives (PF), (poly)p-phenylene vinylene derivatives (PPV), polyphenylene derivatives (PP), poly-p-phenylene derivatives (PPP), polyvinylcarbazole (PVK), polythiophene derivatives, or polymethylphenylsilane (PMPS).

In addition, high molecular substances, such as perylene pigment, coumarin pigment, or rhodamine pigment, or low molecular substances, such as rubrene, perylene, 9,10-diphenylanthracene, tetraphenylbutadien, nilered, coumarin 6, or quinacridone, may be doped into the above-mentioned high molecular materials as the luminescent materials.

Further, instead of the above-mentioned high molecular materials, well-known low molecular materials may be employed. The organic EL layer 60 preferably has a film thickness of about 100 nm.

In the EL display device 1 according to the present embodiment, the organic EL layer 60 is formed such that its light-emitting wavelengths correspond to three primary colors of light. For example, a red-color organic EL layer (60R) whose light-emitting wavelength corresponds to red color, a green-color organic EL layer (60G) whose light-emitting wavelength corresponds to green color, and a blue-color organic EL layer (60B) whose light-emitting wavelength corresponds to blue color are provided in sub-pixels R, G, and B, respectively. At this time, the sub-pixels R, G, and B constitute a single pixel for color displaying.

The hole injecting/carrying layer 70 and the organic EL layer 60 are commonly formed on the sealing-side light-emitting area 73 of the sub-pixel D(n+1) and the substrate-side light-emitting area 74 of the sub-pixel D(n). The hole injecting/carrying layer 70 and the organic EL layer 60 are formed as the light-emitting functional layer area 12AR surrounded by the organic bank (partition wall) 21 partitioning a plurality of sub-pixels (see FIG. 3).

Also, a lyophilic control layer 25 is formed between the organic bank 21 and the planarizing film 85, or the first pixel electrode 23a and the second pixel electrode 23b.

The lyophilic control layer 25 is mainly made of lyophilic material such as $SiO_2$, and allows the hole injecting/carrying layer 70 and the organic EL layer 60 to spread above the pixel electrodes 23a and 23b. Also, the lyophilic control layer 25 is formed between the first pixel electrode 23a and the second pixel electrode 23b. Since the lyophilic control layer 25 is formed at a step part formed by the light-shielding layer 71, concentrated current or short-circuit at the step part can be prevented.

The organic bank 21 is made of acrylic resin or polyimide resin, and its surface has a lyophobic property higher than the lyophilic control layer 25. Inside an opening 25a formed in the lyophilic control layer 25 and an opening 21a formed in the organic bank 21, the hole injecting/carrying layer 70 and the organic EL layer 60 are stacked in this order on the pixel electrodes 23a and 23b.

The organic bank 21 and the TFTs 122 and 123 overlap each other with the planarizing film 85 interposed therebetween in plan view. In other words, the organic bank 21 covers the TFTs 122 and 123 when viewed from the cover substrate 46 side. Also, the TFTs 122 and 123 is configured not to be squeezed into the sealing-side light-emitting area 73.

Also, the term 'lyophilic' in the lyophilic control layer 25 according to the present embodiment implies that the lyophilic control layer 25 has a higher lyophilicity compared with the acrylic resin or polyimide resin constituting the organic bank 21.

Although the light-emitting functional layer 12 has a two-layered structure composed of the hole injecting/carrying layer 70 and the organic EL layer 60 in the present embodiment, it may have a three-layered structure composed of the hole injecting/carrying layer 70, the organic EL layer 60, and an electron injecting layer.

In this case, as a preferable electron injecting layer, for example, a layer composed of a bathocuproin-deposited film and a cesium-deposited film is employed. The layer composed of a bathocuproin-deposited film and a cesium-deposited film is formed by an evaporation method in which bathocuproin and cesium are used as evaporation sources.

In addition to the above-mentioned materials, the electron injecting layer may be made of materials including halogenide or oxide of alkali metals, alkaline earth metals, or rare-earth metals. Examples of alkali metals include Li, Na, and Cs. Examples of alkaline earth metals include Ca, Ba, and Sr. Examples of rare-earth metals include Sm, Th, and Er. These metals are preferably formed as fluoride, but may be formed as halogenide, i.e., chloride or bromide, or oxide. Among such compounds which are materials for forming the electron injecting layer B, materials such as LiF which can be deposited can be manufactured to have an ultrafine particle which has a particle diameter of 1 (m or less by a deposition method by a solvent trap method or cold trap method (e.g., see 'Explanation of dispersion (cohesion and its practical application' (1992), p. 30). Accordingly, by uniformly dispersing the ultrafine particle in a dispersion medium to form a dispersion (colloid), a coating performed by a liquid discharging method, i.e., a film-forming performed by a liquid phase process becomes possible.

The cathode electrode 50 is formed above the light-emitting functional layer 12 and above the organic bank 21.

The cathode electrode 50 has a wider area than a total of the actual display area 4 and the dummy area 5 shown in FIG. 1, and is formed to cover them. The cathode electrode 50 is preferably made of a material which has a high electron injection effect such as Ca, Mg, Na, Li, or metallic compounds. Examples of the metallic compounds include metallic fluoride such as calcium fluoride, metallic oxide such as lithium oxide, or metallo-organic complex such as acetylacetonato calcium. However, these materials have a very large electrical resistance and cannot act as an electrode. Thus, they may be combined with a metal layer, such as Al, Au, Ag, or Cu, or a metallic oxide, such as ITO (Indium Tin Oxide) or tin oxide to form a multilayer structure. In the present embodiment, a multilayer structure composed of lithium fluoride, Mg, and ITO having a film thickness adjusted to be transparent is used.

The light-shielding layer 72 is also formed on the cathode electrode 50.

The light-shielding layer 72 has a light-reflecting property, and is formed within the substrate-side light-emitting area 74 and above the organic bank 21. The light-shielding layer 72 is made of Al, Cr, Ta, Mo, Ti or W, like the above-mentioned light-shielding layer 71. The light-shielding layer 72 is formed by defining the substrate-side light-emitting area 74 and the organic bank, and is configured not to be squeezed into the sealing-side light-emitting area 73.

The light-shielding layer 71 formed in the sealing-side light-emitting area 73 and the light-shielding layer 72 formed in the substrate-side light-emitting area 74 overlap each other at their end portions or partly in plan view. Accordingly, when the EL display device 1 is in a non-light-emitting state, the entire surface of the actual display area 4 is covered by the light-shielding layer when viewed from the sealing side or from the substrate side. Therefore, light leaking does not occur.

Meanwhile, when the EL display device 1 is in a light-emitting state, light emitted from the sealing-side light-emitting area 73 is emitted only to the sealing-side light-emitting area 73, and light emitted from the substrate-side light-emitting area 74 is emitted only to the substrate-side light-emitting area 74.

Although the light-shielding layer 72 has a light-reflecting property in the present embodiment, the light-shielding layer 72 may have a light-absorbing property. In this case, the light-shielding layer 72 is preferably formed of pigment dispersing resin.

The sealing member 13 formed above the cathode electrode 50 will now be described.

The sealing member 13 is formed between the cathode electrode 50 and the cover substrate 46 and includes a transparent protection layer 45A and an adhesive layer 45B, which are sequentially stacked from the cathode electrode 50. Also, the cover substrate 46 is provided on above the adhesive layer 45B.

The transparent protection layer 45A transmits light, and acts as a gas barrier which prevents permeation of water or oxygen from the outside. The transparent protection layer 45A is made of $SiO_x$, $SiN_x$, or $SiO_xN_y$. To use $SiN_x$, it has to become thin enough to be transparent.

The adhesive layer 45B is used to attach the cover substrate 46 to the transparent protection layer 45A, and acts as a buffer which absorbs shock from the outside of the cover substrate 46.

The cover substrate 46 is formed of a transparent substrate to perform a substrate-side light-emitting operation. A glass substrate or a resin substrate is employed as a transparent substrate. Also, the cover substrate 46 preferably has an insulating property.

Operation of the EL display device 1 thus constructed will now be described.

When voltage is applied from a gate wire (not shown) to the gate electrode 42, current flows from the source electrode 43 to the drain electrode 44 by electric field generated in the vicinity of the gate electrode 42, thereby turning on/off the TFTs 122 and 123.

When the TFT 122 is turned on, current flows between the cathode electrode 50 and the first pixel electrode 23a, and electrons and holes are combined in the organic EL layer 60, thereby emitting light. Also, light-emitting intensity is controlled according to the amount of the current. The emitted light is not emitted to the first pixel electrode 23a in which the light-shielding layer 71 is formed, but passes through the cathode electrode 50 and the cover substrate 46 to be emitted from the sealing-side light-emitting area 73. Since the light-shielding layer 71 has a light-reflecting property, the light emitted to the first pixel electrode 23a is reflected by the light-shielding layer 71, passes through the cover substrate 46, and emits from the sealing-side light-emitting area 73. Accordingly, light-emitting in the sealing-side light-emitting area 73 is controlled according to the TFT 122.

Meanwhile, when the TFT 123 is turned on, current flows between the cathode electrode 50 and the second pixel electrode 23b, and electrons and holes are combined in the organic EL layer 60, thereby emitting light. Also, light-emitting intensity is controlled according to the amount of the current. The emitted light is not emitted to the cathode electrode 50 in which the light-shielding layer 72 is formed, but passes through the second pixel electrode 23b and the substrate 20 to be emitted from the substrate-side light-emitting area 74. Since the light-shielding layer 72 has a light-reflecting property, the light emitted to the cathode electrode 23a is reflected by the light-shielding layer 72, passes through the substrate 20, and emits from the substrate-side light-emitting area 74. Accordingly, light emitting in the substrate-side light-emitting area 74 is controlled according to the TFT 123.

Since TFTs 122 and 123 are independently driven in the EL display device 1 according to the present embodiment, light emits independently in the sealing-side light-emitting area 73 and the substrate-side light-emitting area 74. That is, by driving the TFTs 122 and 123 independently, different images can be simultaneously displayed on the front side and the rear side of the EL display device 1.

The sealing-side light-emitting area 73 and the substrate-side light-emitting area 74 are formed in each sub-pixel which emits R, G, or B color, thereby displaying full color on both sides of the EL display device 1.

As described above, in the EL display device 1 according to the present embodiment, the sealing-side light-emitting area 73 and the substrate-side light-emitting area 74 are formed in each sub-pixel, and the light-emitting functional layer 12 emits light independently in the sealing-side light-emitting area 73 and the substrate-side light-emitting area 74, thereby emitting light to the cover substrate 46 and the substrate 20 independently in each sub-pixel.

For example, when there are RGB color sub-pixels within a unit pixel, full-color display can be performed in the unit pixel and, at the same time, can be differently performed in the cover substrate 46 and the substrate 20.

In the present embodiment, since light can be independently emitted to the cover substrate 46 and the substrate 20 in each sub-pixel, problems in the conventional double-sided light-emitting EL display device can be solved. In the related art, since an opposite side of an EL display device can be seen, an image is reversed on the front side and the rear side of a panel. Accordingly, it was not possible to display different images simultaneously on the front side and the rear side of the panel. On the contrary, according to the invention, since the light-shielding layers 71 and 72 are formed in the first pixel electrode 23a in the sealing-side light-emitting area 73 and the cathode electrode 50 in the substrate-side light-emitting area 74, and the light-emitting functional layer 12 emits light independently in the sealing-side light-emitting area 73 and the substrate-side light-emitting area 74, an opposite side of the EL display device 1 cannot be seen and an image cannot be reversed on the front side and the rear side of the panel.

Also, since the light-emitting functional layer 12 emits light independently in the sealing-side light-emitting area 73 and the substrate-side light-emitting area 74, it is possible to easily adjust luminance balance in each area 73 and 74, and to easily change the amount of information in each area 73 and 74.

Also, since the light-shielding layer 71 formed in the first pixel electrode 23a and the light-shielding layer 72 formed in the cathode electrode 50 have a light-reflecting property, it is possible to improve light-emitting efficiency to display an image with a high luminance.

In more detail, light emitted from the light-emitting functional layer 12 in the sealing-side light-emitting area 73 passes through the cathode electrode 50 and the cover substrate 46 and, at the same time, is reflected by the light-shielding layer 71 formed in the first pixel electrode 23a and then passes through the cathode electrode 50 and the sealing member. Meanwhile, light emitted from the light-emitting functional layer 12 in the substrate-side light-emitting area 74 passes through the second pixel electrode 23b and the substrate 20, and at the same time, is reflected by the light-shielding layer 72 formed in the cathode electrode 50 and then passes through the second pixel electrode 23b and the substrate 20. Accordingly, since the light-shielding layer has a light-reflecting property, it is possible to improve light-emitting efficiency in the sealing-side light-emitting area 73 and the substrate-side light-emitting area 74.

In the EL display device 1, the TFTs 122 and 123 are connected to the first pixel electrode 23a and the second pixel electrode 23b, respectively, and the light-emitting functional layer 12 can emit light by driving the TFTs 122 and 123. Accordingly, the light-emitting functional layer 12 can emit light independently in the sealing-side light-emitting area 73 and the substrate-side light-emitting area 74.

In the EL display device 1, since the planarizing film 85 is formed between the first and second pixel electrodes 23a and 23b and the TFTs 122 and 123, the first pixel electrode 23a and the second pixel electrode 23b can be formed on a planarized surface.

Also, since the planarizing film 85 is formed, a light-emitting area can be formed above the TFTs 122 and 123. Accordingly, the sealing-side light-emitting area 73 can be provided above the TFT 122, thereby improving an aperture ratio.

Also, in the EL display device 1, since the light-shielding layer 71 formed on the first pixel electrode 23a in the sealing-side light-emitting area 73 overlaps the TFT 122 with the planarizing film 85 interposed therebetween in plan view, light emitted from the substrate-side light-emitting area 74 passes through the second pixel electrode 23b and the substrate 20 without being blocked by the TFT 122. Accordingly, it is possible to improve efficiency of extracting the light emitted from the substrate-side light-emitting area 74.

Meanwhile, in the related art, when the emitted light is extracted to the substrate side, the emitted light is shielded by a switching element or an array wire, thereby reducing the efficiency of extracting the emitted light. However, the present embodiment can solve this problem.

Also, in the EL display device 1, since the organic bank 21 is formed and the organic bank 21 overlaps the TFTs 122 and 123 with the planarizing film 85 interposed therebetween in plan view, light emitted from the substrate-side light-emitting area 74 passes through the second pixel electrode 23b and the substrate 20 without being blocked by the TFT 123. Accordingly, it is possible to improve efficiency of extracting the light emitted from the substrate-side light-emitting area 74.

Meanwhile, in the related art, when the emitted light is extracted to the substrate 20, the emitted light is shielded by a switching element or an array wire, thereby reducing the efficiency of extracting the emitted light. However, the present embodiment can solve this problem.

In the EL display device 1, the light-emitting functional layer 12 is formed commonly in the sealing-side light-emitting area 73 and the substrate-side light-emitting area 74. Accordingly, since it is not necessary to form the light-emitting functional layer 12 independently in the sealing-side light-emitting area 73 and the substrate-side light-emitting area 74, the light-emitting functional layer 12 can be easily formed.

In the EL display device, since the data lines 102T and 102B, the power line 103, the TFTs 120, 121, and the storage capacitors CT AND CB are not formed in the substrate-side light-emitting area 74, the substrate-side light-emitting operation 74a can be performed. Accordingly, it is possible to improve the efficiency of extracting the emitted light.

Also, since the data lines 102T and 102B, the power line 103, the TFTs 120, 121, and the storage capacitors CT AND CB are formed in the sealing-side light-emitting area 73 and the bank area 21, it can be formed in an area in which the emitted light is not shielded.

First Modification of EL Display Device

A modified example 1 of the EL display device will now be described.

A difference between the EL display device 1 and the modified EL display device will be described.

Although the light-shielding layers 71 and 72 have a light-reflecting property in the above-mentioned EL display device 1, the light-shielding layers 71 and 72 have a light-absorbing property in the modified example 1.

In the EL display device thus configured, when the light-shielding layer 72 having a light-absorbing property is formed on the cathode electrode 50 in the substrate-side light-emitting area 74, the light-shielding layer 72 absorbs external light which is incident from the cover substrate 46. Accordingly, it is possible to improve the contrast of an image displayed on the cover substrate 46.

When the light-shielding layer 71 having a light-absorbing property is formed on the first pixel electrode 23a in the sealing-side light-emitting area 73, the light-shielding layer 71 absorbs external light which is incident from the substrate 20. Accordingly, it is possible to improve the contrast of an image displayed on the substrate 20.

Accordingly, since the light-shielding layers 71 and 72 have a light-absorbing property and act as a black matrix, it is possible to improve the contrast of an image displayed on the sealing-side light-emitting area 73 and the substrate-side light-emitting area 74.

Second Modification of EL Display Device

A modified example 2 of the EL display device will now be described.

A difference between the EL display device 1 and the modified EL display device will be described.

Although the light-emitting functional layer 12 is formed commonly in each sub-pixel in the above-mentioned EL display device 1, the light-emitting functional layer 12 is formed independently in the sealing-side light-emitting area 73 and the substrate-side light-emitting area 74 in the present modified example 2.

In the EL display device 1 thus configured, since the light-emitting functional layer 12 is formed independently in the sealing-side light-emitting area 73 and the substrate-side light-emitting area 74, it is possible to form the light-emitting functional layer 12 having a stable layer thickness in each light-emitting area.

Although the sealing-side light-emitting area 73 and the substrate-side light-emitting area 74 are formed in a sub-pixel in the EL display device 1, the sealing-side light-emitting area 73 and the substrate-side light-emitting area 74 may be formed in a panel of the EL display device. In this case, it is possible to display an image on the cover substrate 46 in the sealing-side light-emitting area 73 of the panel, while it is possible to display an image on the substrate 20 in the substrate-side light-emitting area 74 of the panel. Also, the sealing-side light-emitting area 73 and the substrate-side light-emitting area 74 can display different images independently.

Method of Manufacturing EL Display Device

A method of manufacturing the EL display device 1 will now be described with reference to FIGS. 5 to 7.

FIGS. 5 to 7 are views corresponding to FIG. 2, and are enlarged cross-sectional views of a single sub-pixel in the actual display area 4 of the EL display device 1.

Figure 5A:
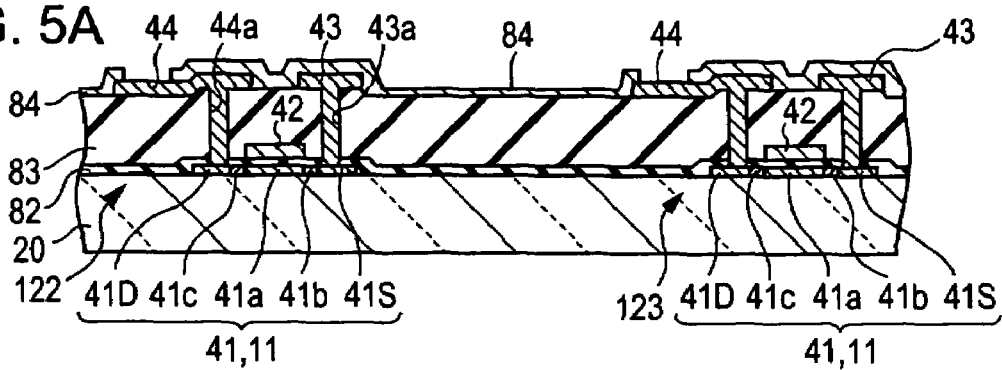
FIG. 5A is a view illustrating a method of manufacturing the EL display device according to the invention.

As shown in FIG. 5A, the TFTs 122 and 123 are formed on the substrate 20 (forming of first and second switching elements). This is performed by using a well-known semiconductor manufacture process.

Also, above the TFTs 122 and 123, the interlayer insulation film 83, contact holes 43a, 44a, the source electrode 43 and the drain electrode 44 are sequentially formed. After forming the passivation film 84 on the entire surface, the drain electrode 44 is partly exposed. The exposed part is joined to the pixel electrodes 23a and 23b afterwards.

Figure 5B:
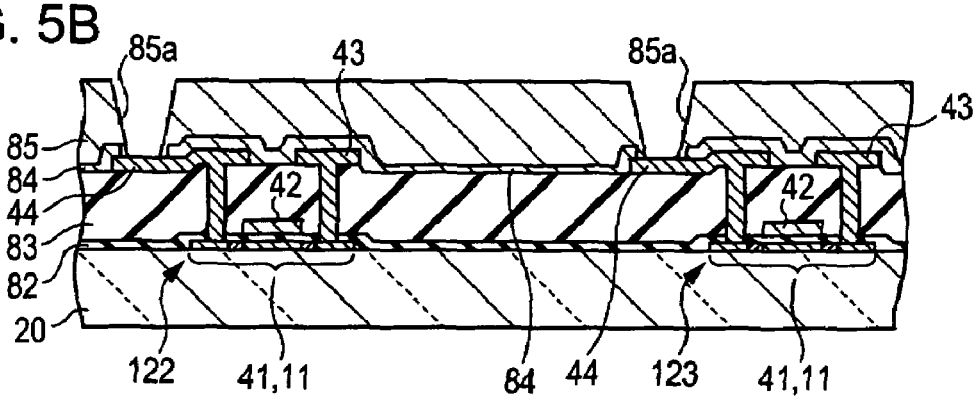
FIG. 5B is a view illustrating a method of manufacturing the EL display device according to the invention.

As shown in FIG. 5B, after forming the planarizing film 85, a contact hole 85a is formed to correspond to the exposed part of the drain electrode 44.

The planarizing film 85 is a layer which is coated by a coating method such as a spin coat method and then formed by a heat treatment process or curing process. The planarizing film 85 is made of materials containing organic materials as a main component. The planarizing film 85 is preferably made of acrylic resin. In addition, the planarizing film 85 may be made of polyimide resin or benzo cyclo butane (BCB) resin.

Figure 5C:
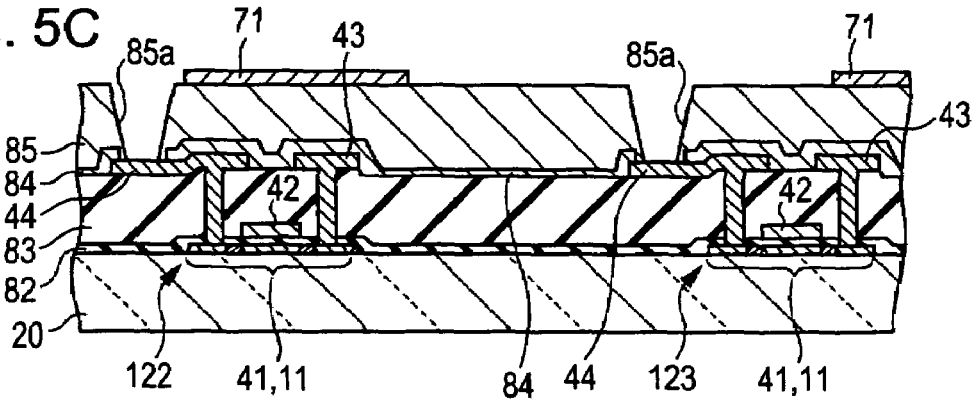
FIG. 5C is a view illustrating a method of manufacturing the EL display device according to the invention.

Next, as shown in FIG. 5C, the light-shielding layer 71 is formed (forming of a light-shielding layer adjacent to the first pixel electrode in the sealing-side light-emitting area).

The light-shielding layer 71 is located below the first pixel electrode 23a to be formed later and is formed in the sealing-side light-emitting area 73. The light-shielding layer 71 has a light-reflecting property or light-absorbing property. When the light-shielding layer 71 has a light-reflecting property, light can be emitted in the sealing-side light-emitting area using reflected light, thereby improving light-emitting efficiency. When the light-shielding layer 71 has a light-absorbing property, it acts as a black matrix, thereby improving the contrast.

When the light-shielding layer 71 has a light-reflecting property, a metallic film such as Al, Cr, Ta, Mo, Ti, or W is formed on the entire surface of the planarizing film 85, and then is formed in a predetermined pattern by a photolithography method or a patterning method.

Meanwhile, when the light-shielding layer 71 has a light-absorbing property, a liquid material containing pigment dispersing resin is applied on the entire surface of the planarizing film 85, is subjected to a cure process, and then is formed in a predetermined pattern through a photolithography method or a patterning method.

Figure 5D:
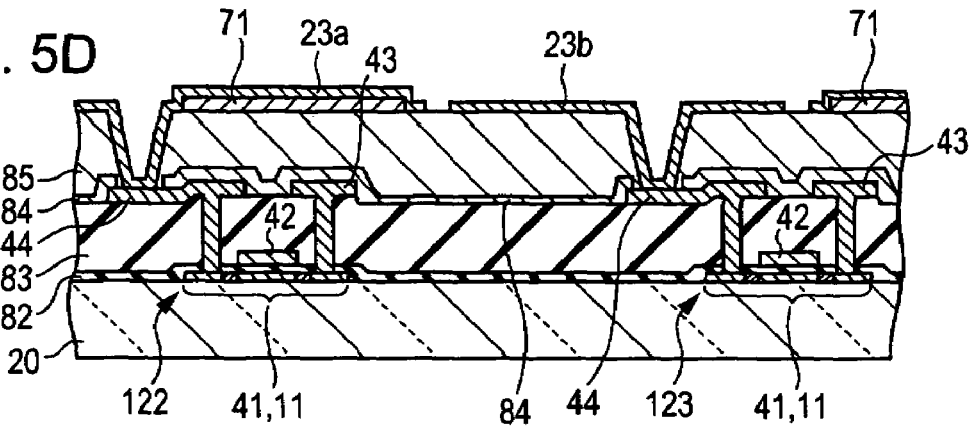
FIG. 5D is a view illustrating a method of manufacturing the EL display device according to the invention.

Next, as shown in FIG. 5D, the first pixel electrode 23a and the second pixel electrode 23b are formed (forming the first and second pixel electrodes which are respectively connected to the first and second switching elements).

The first pixel electrode 23a and the second pixel electrode 23b are respectively connected to the drain electrode 44 of the TFTs 122 and 123 through the contact hole 85a of the planarizing film 85. The first pixel electrode 23a and the second pixel electrode 23b are formed using a transparent conductive film such as ITO as described above. Also, it is formed in a predetermined pattern through a photolithography method or a patterning method.

The first pixel electrode 23a and the second pixel electrode 23b are formed in each sub-pixel. Accordingly, the sealing-side light-emitting operation and the substrate-side light-emitting operation can be performed in each sub-pixel.

Figure 6A:
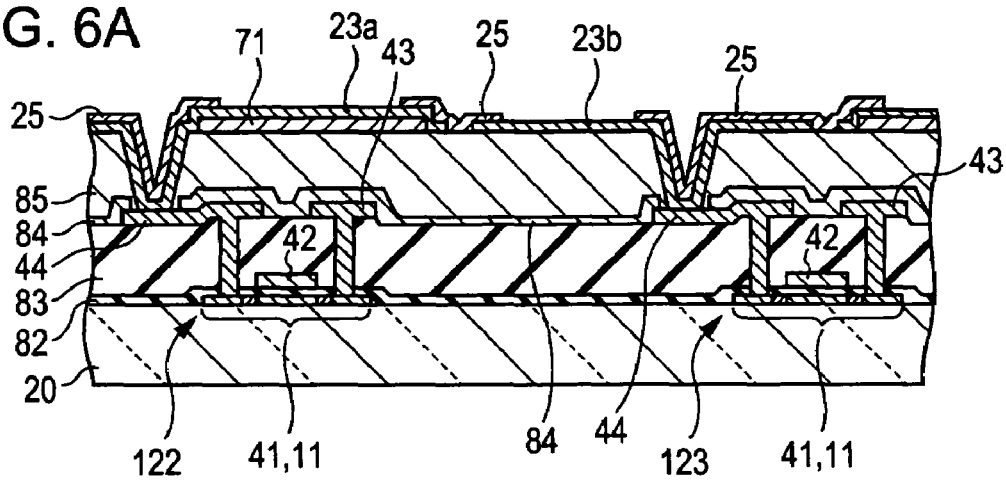
FIG. 6A is a view illustrating a method of manufacturing the EL display device according to the invention.

Next, as shown in FIG. 6A, the lyophilic control layer 25 is formed.

In this process, it is formed between the first pixel electrode 23a and the second pixel electrode 23b. The lyophilic control layer 25 is mainly made of a lyophilic material such as $SiO_2$, and allows the hole injecting/carrying layer 70 and the organic EL layer 60 to spread above the pixel electrodes 23a and 23b. Since the lyophilic control layer 25 is formed at a step part formed by the light-shielding layer 71, concentrated current or short-circuit at the step part can be prevented.

Figure 6B:
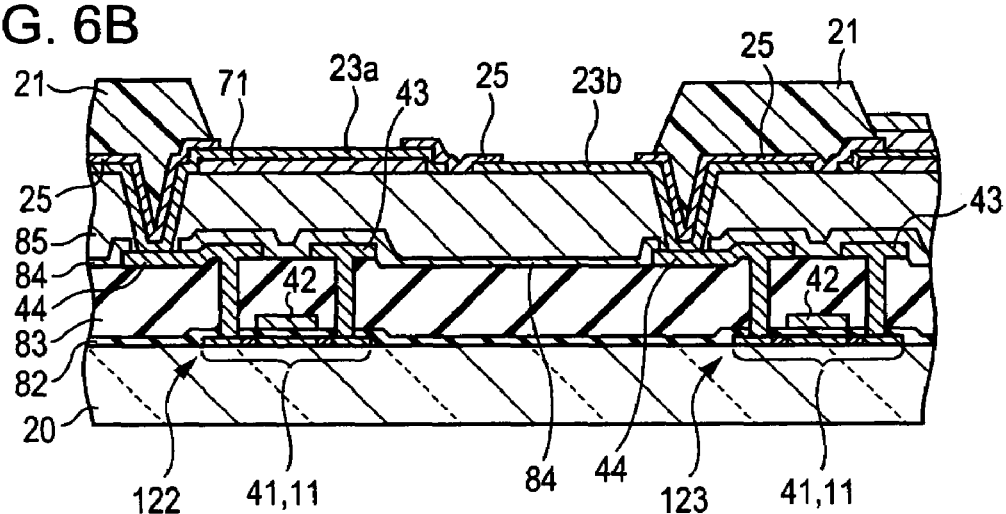
FIG. 6B is a view illustrating a method of manufacturing the EL display device according to the invention.

Next, as shown in FIG. 6B, the organic bank 21 is formed.

This process is performed using a coating method such as a spin coat method. In more detail, resin material such as acrylic resin or polyimide resin is dissolved in a solvent. A solution thus obtained is coated and is then subjected to a cure process. A resist is coated, and then the resist is partly removed by the photolithography method. Next, the resin material in a resist opening is removed, thereby forming the organic bank 21. When the organic bank 21 is made of a photosensitive resin, a process of coating a resist is not necessary.

Figure 6C:
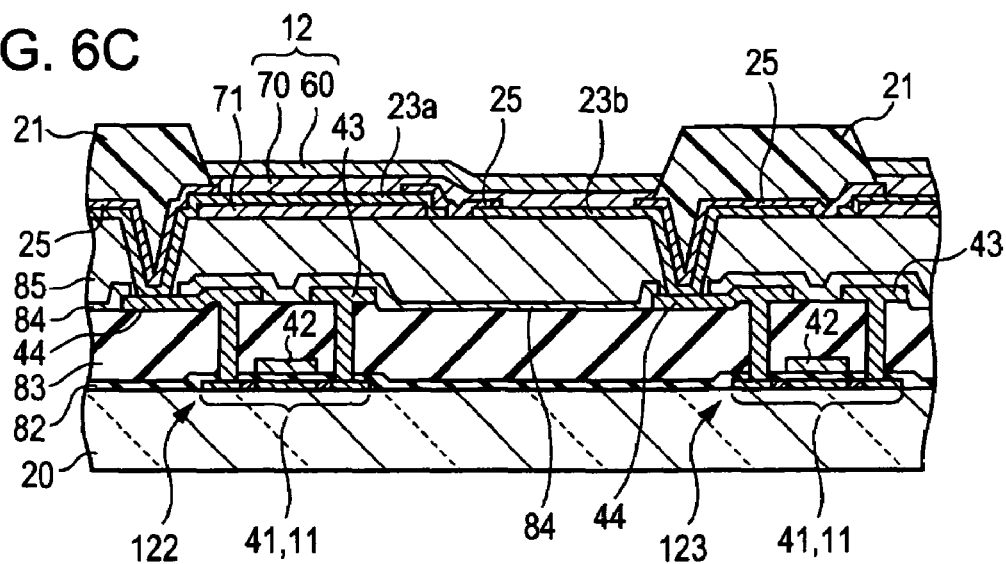
FIG. 6C is a view illustrating a method of manufacturing the EL display device according to the invention.

Next, as shown in FIG. 6C, the light-emitting functional layer 12 is formed (forming a light-emitting functional layer above the first and second pixel electrodes).

In order to form the hole injecting/carrying layer 70 and the organic EL layer 60 constituting the light-emitting functional layer 12, a liquid discharging method is preferably used. In the liquid discharging method, it is possible to eject and fix a liquid material, which is obtained by dissolving various materials in a preferred solvent, to a minute area. Accordingly, since the photolithography method is not necessary, waste of materials is prevented, thereby reducing manufacturing cost.

Figure 7A:
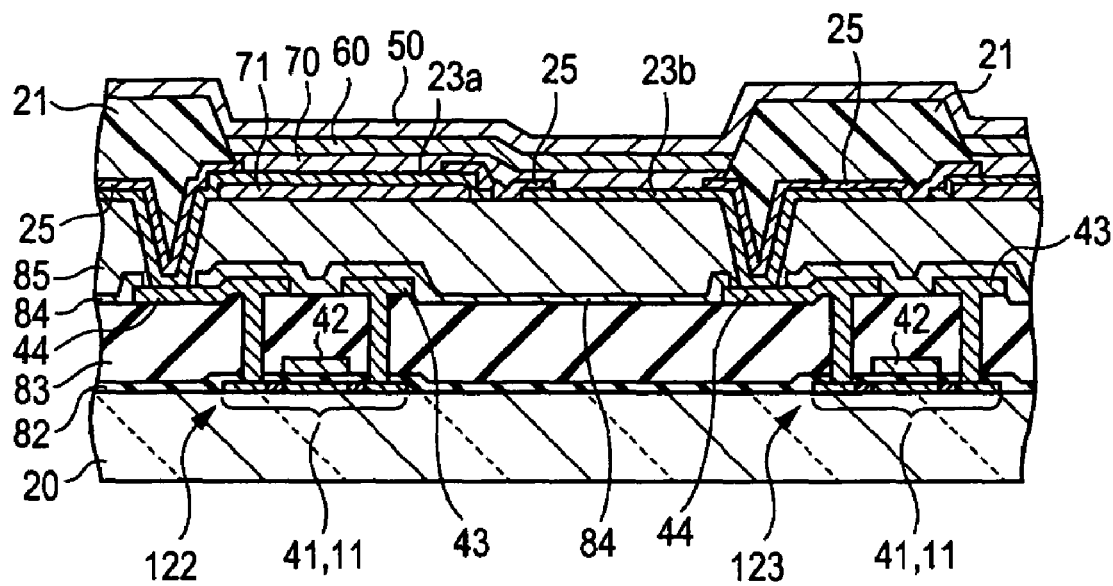
FIG. 7A is a view showing a method of manufacturing the EL display device according to the invention.

Next, as shown in FIG. 7A, the cathode electrode 50 is formed (forming a counter electrode facing the first and second pixel electrodes).

In order to form the cathode electrode 50, a deposition method is used. By the deposition method, the cathode electrode 50 is formed on the entire surface of the actual display area 4 including the organic EL layer 60 or the organic bank 21.

Although the cathode electrode 50 is formed on the organic EL layer 60 in the present embodiment, an electronic injecting layer may be formed between the organic EL layer 60 and the cathode electrode 50. To form the electronic injecting layer, a mask deposition method is used.

Figure 7B:
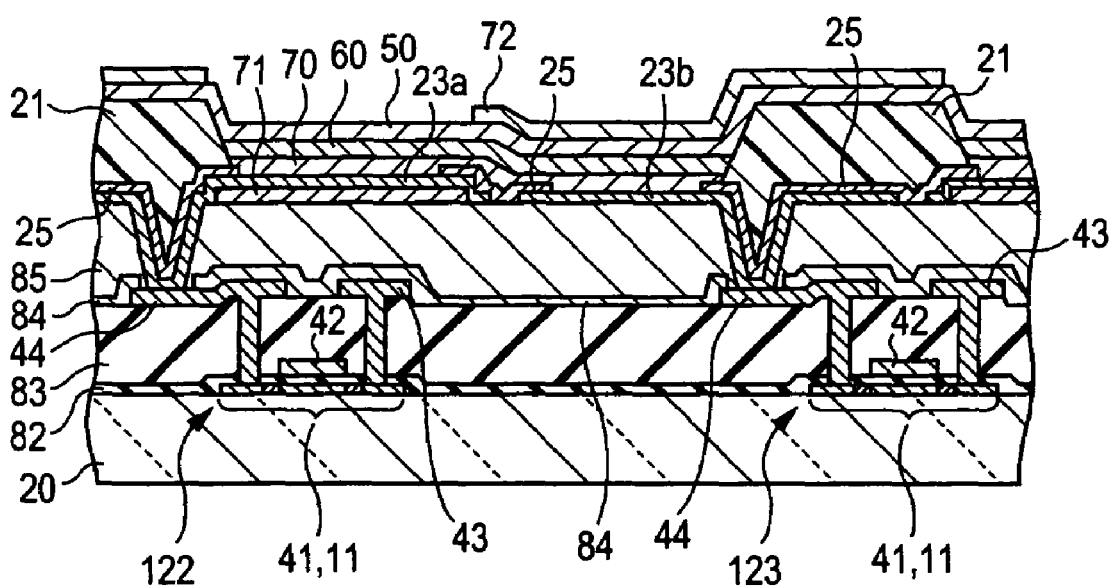
FIG. 7B is a view showing a method of manufacturing the EL display device according to the invention.

Next, as shown in FIG. 7B, the light-shielding layer 72 is formed (forming a light-shielding layer adjacent to each counter electrode in the substrate-side light-emitting area).

To form the light-shielding layer 72, the mask deposition method is used. By the mask deposition method, the light-shielding layer 72 can be formed only in a predetermined part.

The light-shielding layer 72 is formed on the substrate-side light-emitting area 74. Also, the light-shielding area 72 has a light-reflecting property or light-absorbing property. When the light-shielding layer 72 has a light-reflecting property, it is possible to emit light in the substrate-side light-emitting area using reflected light, thereby improving light-emitting efficiency. Meanwhile, when the light-shielding layer 72 has a light-reflecting property, it acts as a black matrix, thereby improving the contrast.

When the light-shielding layer 71 has a light-reflecting property, a metallic film such as Al, Cr, Ta, Mo, Ti, or W is formed on the entire surface of the planarizing film 85, and then is formed in a predetermined pattern by a photolithography method or a patterning method.

Meanwhile, when the light-shielding layer 71 has a light-absorbing property, a liquid material containing pigment dispersing resin is applied on the entire surface of the planarizing film 85, is subjected to a cure process, and then is formed in a predetermined pattern through a photolithography method or a patterning method.

As shown in FIG. 1, the transparent protection layer 45A is formed above the cathode electrode 50 and the light-shielding layer 72. The transparent protection layer 45A is made of $SiO_x$, $SiN_x$, or $SiO_xN_y$. When $SiN_x$ is used, it is necessary to be thin enough to be transparent.

The adhesive layer 45B is provided on the transparent protection layer 45A and the cover substrate 46 is attached to the adhesive layer 45B (forming a sealing member which seals the light-emitting functional layer). As a result, the EL display device 1 is completed.

The EL display device 1 thus configured includes the sealing-side light-emitting area 73 and the substrate-side light-emitting area 74 in a sub-pixel. Accordingly, the EL display device 1 becomes a double emission type EL display device which can emit light on both faces.

As described above, according to the method of manufacturing the EL display device 1 of the present embodiment, it is possible to manufacture the EL display device.

Since the first pixel electrode 23a and the second pixel electrode 23b are formed in each sub-pixel and the sealing-side light-emitting area 73 and the substrate-side light-emitting area 74 are formed in each sub-pixel, the light-emitting functional layer 12 can emit light independently in each area 73 and 74.

In addition, by the mask deposition method, the light-shielding layer 72 is formed on the cathode electrode 50 in the substrate-side light-emitting area 74. Accordingly, the light-shielding layer 72 can be formed by depositing according to a predetermined mask pattern.

Electronic Apparatus

Figure 8:
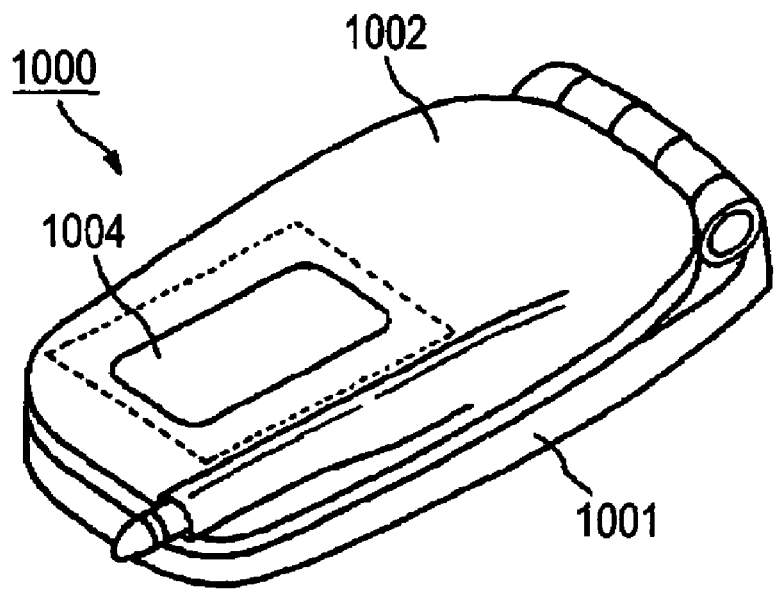
FIG. 8 is a perspective view illustrating an electronic apparatus according to the invention.
Figure 9:
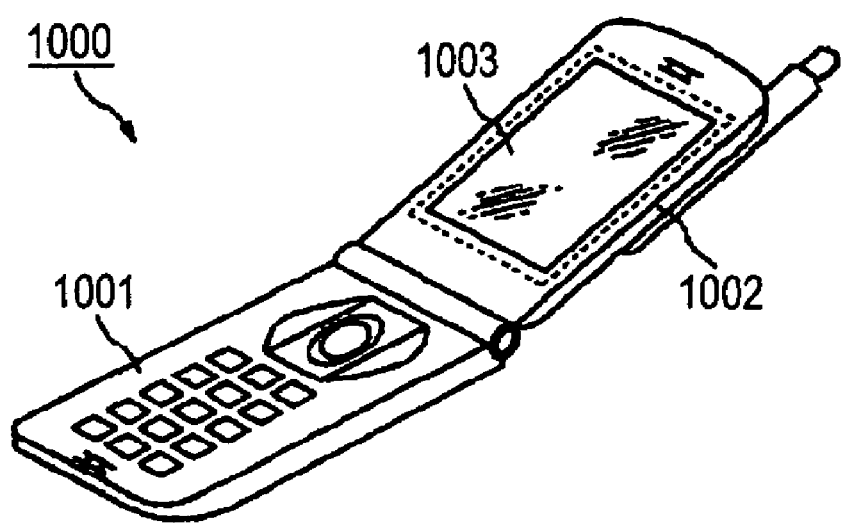
FIG. 9 is a perspective view illustrating an electronic apparatus according to the invention.

An electronic apparatus according to the invention will now be described with reference to FIGS. 8 and 9. FIG. 8 shows a mobile phone 1000, an electronic apparatus according to an embodiment of the invention, which is folded. FIG. 9 shows a mobile phone 1000 which is unfolded. The mobile phone 1000 includes a main body 1001 and a display unit 1002.

The EL display device 1 according to the above-mentioned embodiments is provided inside the display unit 1002. Through the display unit 1002, a user can view an image on a front-side display 1003 and on a rear-side display 1004. In the mobile phone 1000, the user can view a bright image on the front-side display 1003 and/or the rear-side display 1004 according to various operations or conditions, for example, when the mobile phone 1000 is folded or unfolded.

Although a folder-type mobile phone has been described in the present embodiment, the EL display device according to the invention can be applied to other electronic apparatus.

The EL display device and the electronic apparatus according to the invention are not limited to the above-mentioned exemplary embodiments, but various changes in form and details may be made therein without departing from the scope of the invention.

What is claimed is:

1. An EL display device comprising:
   first and second pixel electrodes formed above a substrate, for each sub-pixel within a unit pixel;
   a counter electrode opposite to the first and second pixel electrodes;
   a light-emitting layer provided between the first and second pixel electrodes and the counter electrode;
   a sealing member which seals the light-emitting functional layer;
   an organic bank surround the light-emitting layer; and
   a lyophilic control layer disposed between the first pixel electrode and the second pixel electrode, and having a higher lyophobic property than the organic bank,
   wherein the first and second pixel electrodes and the counter electrode are formed of a transparent conductive film,
   a sealing-side light-emitting area for extracting light emitted from the light-emitting layer from the sealing member is composed of the first pixel electrode,
   a substrate-side light-emitting area for extracting light emitted from the light-emitting functional layer from the substrate is composed of the second pixel electrode, and
   the light-emitting layer emits light independently in the sealing-side light-emitting area and the substrate-side light-emitting area.

2. The EL display device according to claim 1, wherein at least one of the light-shielding layers formed on the first pixel electrode and the light-shielding layer formed on the counter electrode has a light-reflecting property.

3. The EL display device according to claim 1, wherein at least one of the light-shielding layers formed on the first pixel electrode and the light-shielding layer formed on the counter electrode has a light-absorbing property.

4. The EL display device according to claim 1, wherein a planarizing film is formed between the first and second pixel electrodes and the first and second switching elements.

5. The EL display device according to claim 1, wherein, in the sealing-side light-emitting area, the light-shielding layer formed on the first pixel electrode overlaps the first switching element with the planarizing film interposed there between in plan view.

6. The EL display device according to claim 1, wherein the first and second switching elements are formed in an area other than the substrate-side light-emitting area.

7. The EL display device according to claim 1, wherein each of the first and second switching elements is connected to a capacitive element, and
   the capacitive element overlaps the sealing-side light-emitting area.

8. The EL display device according to claim 1, wherein each of the first and second switching elements is connected to a power line, and the power line overlaps the sealing-side light-emitting area.

9. The EL display device according to claim 1,
wherein a partition wall is formed to partition the light-emitting functional layer, and
the partition wall overlaps at least one of the first and second switching elements with the planarizing film interposed there between in plan view.

10. The EL display device according to claim 1,
wherein first and second switching elements are connected to each of the first and second pixel electrodes, and the light-emitting functional layer emits light by driving the first and second switching elements.

11. The EL display device according to claim 1,
wherein the light-emitting functional layer is formed commonly in the sealing-side light-emitting area and the substrate-side light-emitting area.

12. The EL display device according to claim 1,
wherein the light-emitting functional layer is formed independently in the sealing-side light-emitting area and the substrate-side light-emitting area.

\* \* \* \* \*